(12) United States Patent
Isobe (10) Patent No.: US 10,256,224 B2
(45) Date of Patent: Apr. 9, 2019

(54) MULTIPLE-UNIT SEMICONDUCTOR DEVICE

(71) Applicant: SHARP KABUSHIKI KAISHA, Sakai, Osaka (JP)

(72) Inventor: Masaya Isobe, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 239 days.

(21) Appl. No.: 15/126,204

(22) PCT Filed: Feb. 12, 2015

(86) PCT No.: PCT/JP2015/053757
§ 371 (c)(1),
(2) Date: Sep. 14, 2016

(87) PCT Pub. No.: WO2015/174107
PCT Pub. Date: Nov. 19, 2015

(65) Prior Publication Data
US 2017/0084600 A1    Mar. 23, 2017

(30) Foreign Application Priority Data

May 16, 2014 (JP) ................................. 2014-102277

(51) Int. Cl.
*H01L 27/02* (2006.01)
*H01L 21/822* (2006.01)
(Continued)

(52) U.S. Cl.
CPC ........ *H01L 27/0248* (2013.01); *H01L 21/822* (2013.01); *H01L 23/4952* (2013.01); *H01L 23/49562* (2013.01); *H01L 23/49568* (2013.01); *H01L 23/49575* (2013.01); *H01L 27/04* (2013.01); *H01L 29/16* (2013.01); *H01L 29/2003* (2013.01); *H01L 29/7787* (2013.01); *H01L 29/78* (2013.01); *H03K 17/063* (2013.01);
(Continued)

(58) Field of Classification Search
CPC .................................................. H01L 27/0248
See application file for complete search history.

(56) References Cited

U.S. PATENT DOCUMENTS

| 5,596,474 A | 1/1997 | Wada et al. |
| 2005/0047042 A1 | 3/2005 | Satou et al. |

(Continued)

FOREIGN PATENT DOCUMENTS

| JP | 8-97362 A | 4/1996 |
| JP | 2005-72057 A | 3/2005 |

*Primary Examiner* — Scott Bauer
(74) *Attorney, Agent, or Firm* — Birch, Stewart, Kolasch & Birch, LLP (57) ABSTRACT

A multiple-unit semiconductor device (1) includes a normally-ON type first FET (11) and a normally-OFF type second FET (12) that are connected to each other in series between a first terminal and a second terminal (17 and 19). The multiple-unit semiconductor device (1) further includes a protection circuit that includes a switching element for discharge (16) connected to the second FET in parallel and a trigger circuit that is disposed between the first terminal and the second terminal (17 and 19) and causes the switching element for discharge to turn to an ON state when a surge is applied to the first terminal.

6 Claims, 8 Drawing Sheets

(51) Int. Cl.
    *H01L 27/04*       (2006.01)
    *H03K 17/687*     (2006.01)
    *H01L 23/495*     (2006.01)
    *H01L 29/16*       (2006.01)
    *H01L 29/20*       (2006.01)
    *H01L 29/778*     (2006.01)
    *H01L 29/78*       (2006.01)
    *H03K 17/06*      (2006.01)
    *H03K 17/16*      (2006.01)

(52) U.S. Cl.
    CPC ......... *H03K 17/165* (2013.01); *H03K 17/687* (2013.01); *H01L 2224/0603* (2013.01); *H01L 2224/48137* (2013.01); *H01L 2224/48247* (2013.01); *H01L 2224/4903* (2013.01); *H01L 2224/49113* (2013.01)

(56) References Cited

U.S. PATENT DOCUMENTS

| | | | |
|---|---|---|---|
| 2006/0250732 A1* | 11/2006 | Peachey | H01L 27/0259 361/56 |
| 2011/0199148 A1 | 8/2011 | Iwamura | |
| 2014/0284662 A1* | 9/2014 | Ikeda | H01L 27/0255 257/195 |

* cited by examiner

TO GATE TERMINAL 18    TO NODE A

MULTIPLE-UNIT SEMICONDUCTOR DEVICE

TECHNICAL FIELD

The present invention relates to a multiple-unit semiconductor device.

BACKGROUND ART

A transistor formed from a wide band gap semiconductor represented by GaN, SiC, or the like has excellent characteristics of having high-speed switching, a low ON-state resistance value, and low capacitance compared to a transistor formed from a silicon semiconductor. Therefore, it is expected that it will be applied to a control apparatus or a power converter such as an AC/DC converter and an inverter.

Figure 8:
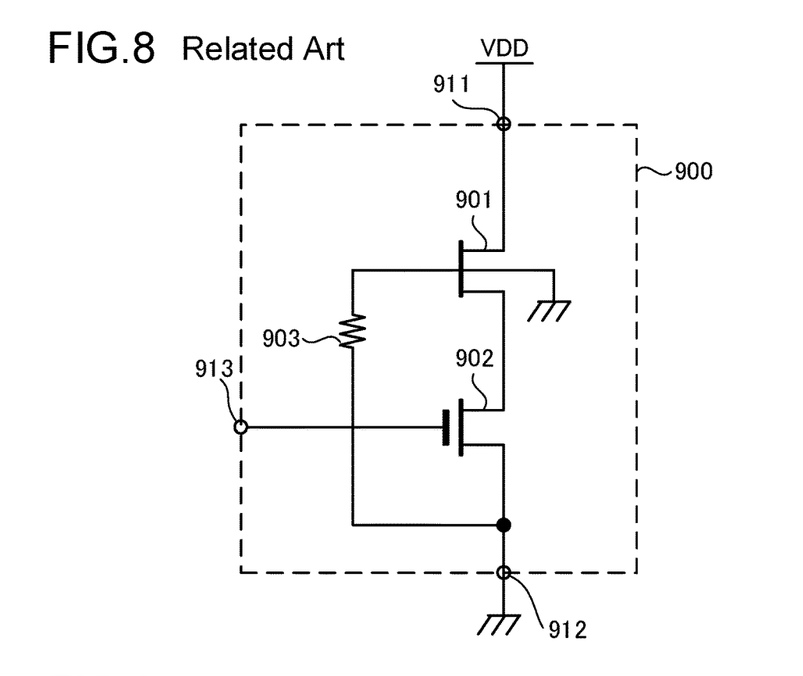
FIG. 8 is a circuit diagram of a multiple-unit semiconductor device in the related art in which a normally-ON type transistor and a normally-OFF type transistor are cascode-connected.

Some transistors formed from a wide band gap semiconductor exhibit a normally-ON property in which a threshold voltage becomes negative. However, since it is often a burden in circuit design to provide a negative gate voyage, a configuration illustrated in FIG. 8 is preferably adopted, in which a multiple-unit semiconductor device is formed by cascode-connection of a GaN transistor 901 that is a normally-ON type transistor and a MOSFET 902 that is a normally-OFF type transistor, and operates as one transistor at a positive gate voltage.

The multiple-unit semiconductor device 900 includes a drain terminal 911 to which a power supply voltage VDD is applied, a source terminal 912 connected to the ground, and a gate terminal 913. The drain terminal 911 is connected to a drain of the GaN transistor 901, and the source terminal 912 is connected to a source of the MOSFET 902, and a source of the GaN transistor 901 and a drain of the MOSFET 902 are commonly connected to each other. A gate of the GaN transistor 901 is connected to the source terminal 912 via a resistance element 903 and a gate of the MOSFET 902 is connected to the gate terminal 913. A substrate terminal of the GaN transistor 901 is connected to the ground.

In this configuration, when a gate voltage of the MOSFET 902 equal to or higher than a positive threshold voltage is applied to the gate terminal 913, the MOSFET 902 is in an ON state, and thus, the state between the terminals 911 and 912 becomes conductive. In a case where a gate voltage to the gate terminal 913 is lower than the threshold voltage, the MOSFET 902 is in an OFF state and a voltage lower than the threshold voltage of the GaN transistor 901 is generated between the gate and source of the GaN transistor 901, and thus, the GaN transistor 901 is in an OFF state. Therefore, the state between the terminals 911 and 912 becomes non-conductive. That is, the multiple-unit semiconductor device 900 realizes an operation as one transistor.

In many cases of forming a product, two chips (a GaN transistor 901 chip and a MOSFET 902 chip) are accommodated in one package, and thus, a user can use the multiple-unit semiconductor device 900 as if the user treats an ordinary transistor.

On the other hand, in order to protect the internal circuit from a surge due to static electricity generated by a human body or a machine, that is, an electro-static discharge (ESD) surge, an ESD protection circuit is usually connected to or embedded in a semiconductor device or an integrated circuit. The ESD protection circuit operates only when the ESD surge is applied, and makes an ESD surge current immediately flow to the ground side. In this way, the damage to the internal circuit by the ESD surge is reduced.

In the PTLs 1 and 2 below, configurations for protecting an internal circuit from an ESD surge are disclosed.

CITATION LIST

Patent Literature

PTL 1: Japanese Unexamined Patent Application Publication No. 2005-72057

PTL 2: Japanese Unexamined Patent Application Publication No. 8-97362

SUMMARY OF INVENTION

Technical Problem

Figure 9:
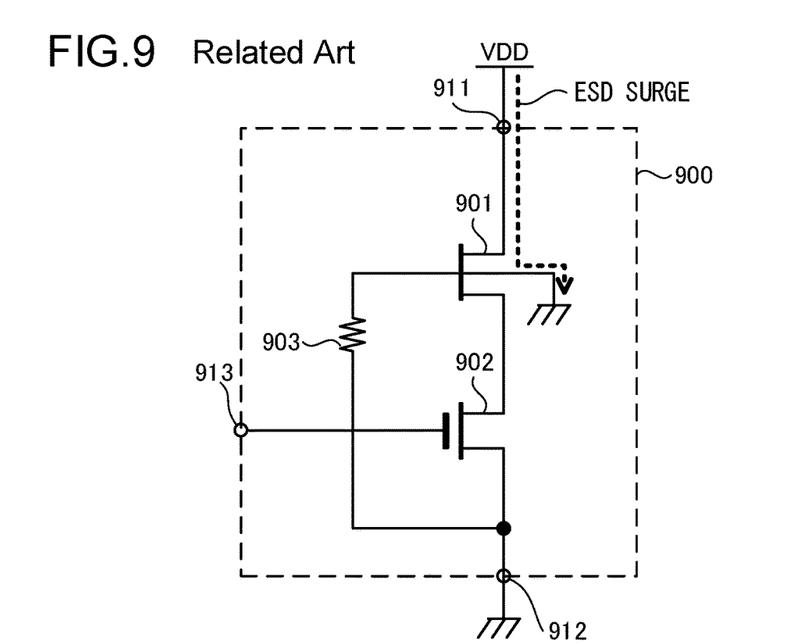
FIG. 9 is a diagram for describing a discharge path when an ESD surge is applied to the multiple-unit semiconductor device in FIG. 8.

Incidentally, an ESD resistance of the GaN transistor 901 is usually lower than that of the MOSFET 902. For example, with respect to a human body model (HBM), the ESD resistance of the GaN transistor 901 is approximately only 1 kV, while the ESD resistance of the MOSFET 902 is equal to or higher than 2 kV. For example, in FIG. 8, when the ESD surge (the surge due to the ESD) is applied to the power supply voltage VDD, the ESD surge flows into the multiple-unit semiconductor device 900 through the drain terminal 911. At this time, when the GaN transistor 901 and the MOSFET 902 are in an OFF state, the ESD surge flows into the drain of the GaN transistor 901 and the flowed-in ESD surge is discharged toward the substrate terminal of the GaN transistor 901 (refer to FIG. 9). The GaN transistor 901 comparatively easily damaged by the ESD current due to this discharge. It is desirable to suppress the flow of the ESD surge current through this path.

Figure 10:
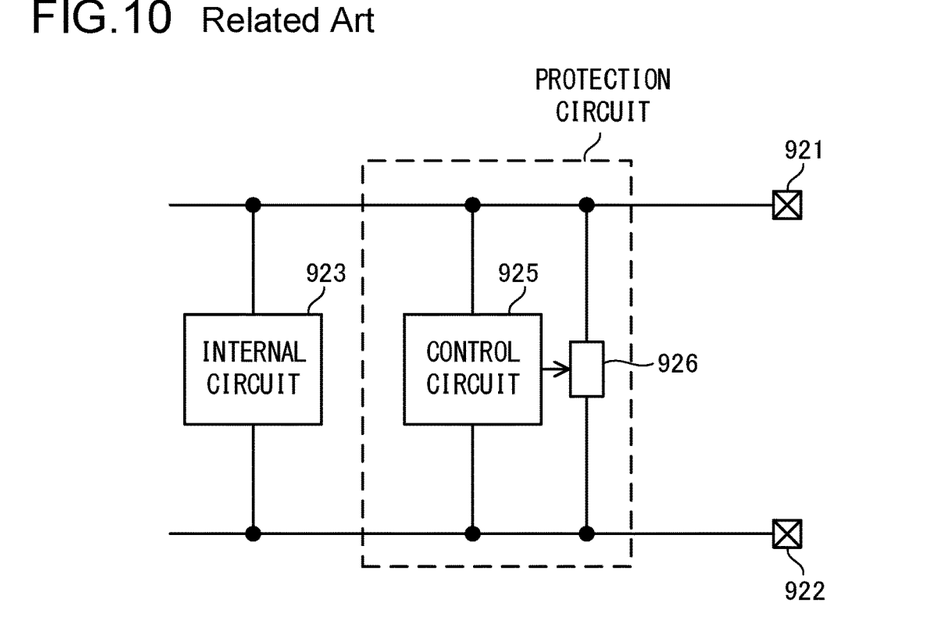
FIG. 10 is a block configuration diagram of a circuit including a protection circuit corresponding to content disclosed in PTL 1.

FIG. 10 is a block configuration diagram of a circuit including a protection circuit corresponding to details disclosed in PTL 1. In FIG. 10, a switching element 926 is connected in parallel to an internal circuit 923. When a high voltage due to ESD or the like is applied between the terminals 921 and 922, a control signal is output to a switching element 926 from a control circuit 925. Then, the switching element 926 is in an ON state, and thus, the ESD surge immediately flows to the ground, and the internal circuit 923 is protected.

In the configuration illustrated in FIG. 10, the configuration becomes complicated as much as the switching element 926 and the control circuit 925, which controls the switching element 926, become necessary. The complicated configuration leads to an increase of an area of the chip, a cost, and the like. The control circuit 925 needs to operate to make the switching element 926 turn to an ON state before the internal circuit 923 is damaged by the applied ESD surge, and thus, it is essential to operate the protection circuit at a high-speed. The necessity of the high-speed operation causes various constraints in design or the like.

Figure 11:
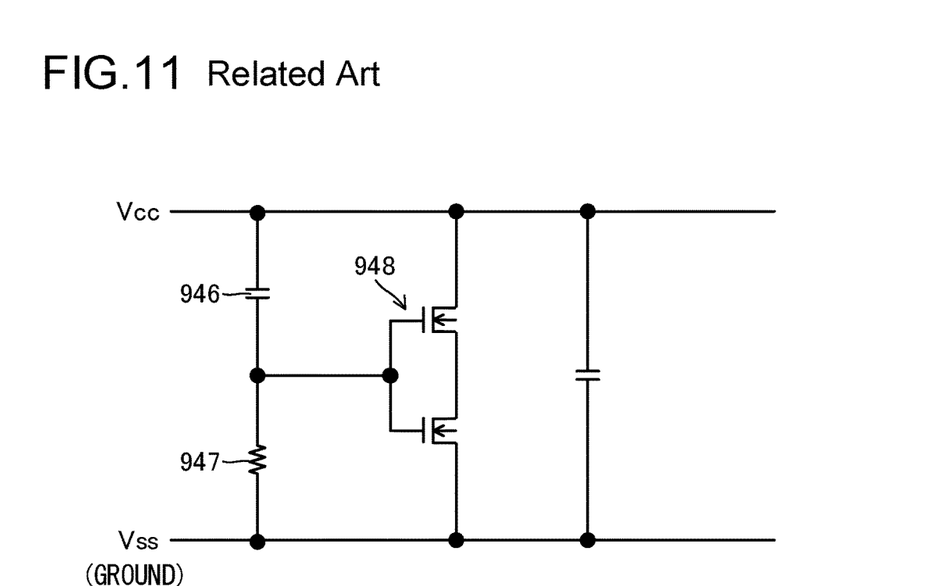
FIG. 11 is a diagram illustrating a protection circuit corresponding to content disclosed in PTL 2.

FIG. 11 illustrates a protection circuit corresponding to details disclosed in PTL 2. In the configuration illustrated in FIG. 11, when the ESD surge is applied to the power supply voltage Vcc, the ESD surge current flows through the series circuit of a capacitor 946 and a resistance element 947, and a voltage is generated at the resistance element 947. The cascode MOSFET 948 that is connected to the connection point between the capacitor 946 and the resistance element 947 turns to an ON state at this generated voltage, and then, the ESD surge flows to the ground. In this way, it is possible to protect the internal circuit that is connected in parallel to the protection circuit from being damaged by the ESD surge.

However, in the configuration in FIG. 11, since a cascode-connected two-stage MOSFET structure is used, the operation speed becomes low. Furthermore, the configuration becomes complicated as much as the two-stage MOSFET structure becomes necessary.

In the multiple-unit semiconductor device, it is important to improve the overall ESD resistance of the multiple-unit semiconductor device while considering that the ESD resistance of the GaN transistor is low. However, in view of the cost, it is not preferable to add a complicated protection circuit which causes a large increase of the area of the chip.

The present invention has an object to provide a multiple-unit semiconductor device that can contribute to an improvement in resistance to an ESD surge or the like with a simple configuration.

Solution to Problem

A multiple-unit semiconductor device in the present invention includes a normally-ON type first FET and a normally-OFF type second FET that are connected to each other in series between a first terminal and a second terminal. The device further includes a protection circuit that includes a switching element for discharge connected to the second FET in parallel and a trigger circuit that is disposed between the first terminal and the second terminal and causes the switching element for discharge to turn to an ON state when a surge is applied to the first terminal.

Advantageous Effects of Invention

According to the present invention, it is possible to provide a multiple-unit semiconductor device that can contribute to an improvement in resistance to an ESD surge or the like with a simple configuration.

DESCRIPTION OF EMBODIMENTS

Hereinafter, examples of the embodiments of the present invention will be described in detail with reference to the drawings. In the reference drawings, the same reference signs will be given to the same portions and descriptions for the same portions will not be repeated in principle. In this description, in order to make the description simple, symbols or signs referring to information, signal, physical quantity, state quantity or members may be used, and thus, the names of those information, signal, physical quantity, state quantity or members corresponding to the symbols or the signs may be omitted or abbreviated.

First Embodiment

Figure 1:
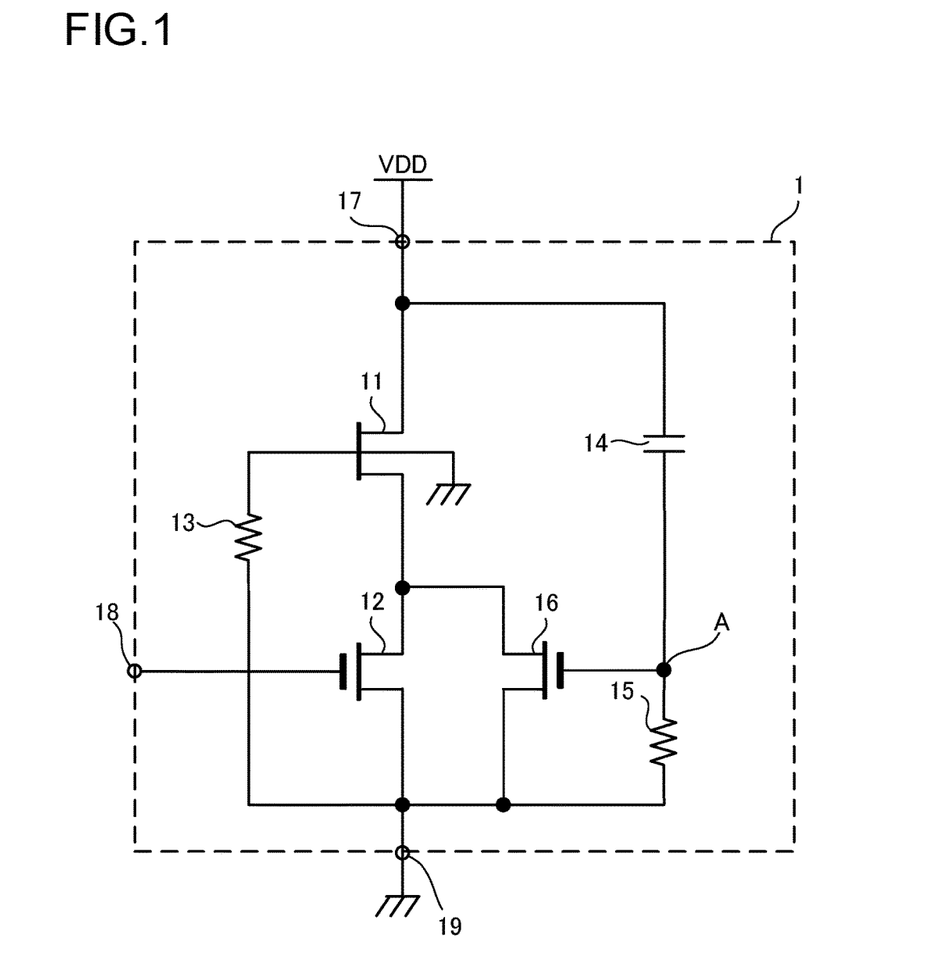
FIG. 1 is a circuit diagram of a multiple-unit semiconductor device in a first embodiment of the present invention.

The first embodiment of the present invention will be described. A circuit diagram of a multiple-unit semiconductor device (a multiple-unit switching element) 1 in the first embodiment is illustrated in FIG. 1. The multiple-unit semiconductor device 1 includes field effect transistors (hereinafter, referred to as FETs) 11 and 12 that are connected to each other in series, a resistance element 13, a capacitor 14, a resistance element 15, an FET (discharge FET) 16, a drain terminal 17, a gate terminal 18, and a source terminal 19. Each of the FETs 11, 12, and 16 is N-channel type FETs.

A power supply voltage VDD from a power circuit (not illustrated) is applied to the drain terminal 17. Therefore, the drain terminal 17 can be called a power terminal. The power supply voltage VDD is a positive voltage seen from a ground potential of zero V (volt). The source terminal 19 is connected to the ground having the ground potential. Therefore, the source terminal 19 can be called a ground terminal.

FET 11 is a gallium nitride field effect transistor (GaN-FET), that is, a normally-ON type FET that is formed from a gallium nitride semiconductor. Therefore, hereinafter, the FET 11 will also be referred to as a GaNFET 11. The normally-ON type FET is in an ON state even when the gate voltage is zero V (volt). That is, a threshold voltage $V_{TH11}$ of the GaNFET 11, which is one of the electric characteristics of the GaNFET 11 has a predetermined negative value. The state of the GaNFET 11 becomes ON when the gate voltage to the GaNFET 11 is equal to or higher than the threshold voltage $V_{TH11}$ and becomes OFF when the gate voltage to the GaNFET 11 is lower than the threshold voltage $V_{TH11}$.

Each of the FETs 12 and 16 is an insulation gate type FET, that is, metal oxide semiconductor field effect transistor (MOSFET), and is a normally-OFF type FET. Therefore, hereinafter, the FETs 12 and 16 are also referred to as MOSFETs 12 and 16, respectively. The MOSFETs 12 and 16 can be formed from the silicon semiconductor. The state of the normally-OFF type FET becomes OFF when the gate voltage becomes zero V (volt). That is, a threshold voltage $V_{TH12}$ of the MOSFET 12 which is one of the electric characteristics of the MOSFET 12 has a predetermined positive value, and a threshold voltage $V_{TH16}$ of the MOSFET 16 which is one of the electric characteristics of the MOSFET 16 has a predetermined positive value. The state of the MOSFET 12 becomes ON when the gate voltage to the MOSFET 12 is equal to or higher than the threshold voltage $V_{TH12}$, and becomes OFF when the gate voltage is lower than the threshold voltage $V_{TH12}$. The state of the MOSFET 16 becomes ON when the gate voltage to the MOSFET 16 is equal to or higher than the threshold voltage $V_{TH16}$, and becomes OFF when the gate voltage is lower than the threshold voltage $V_{TH16}$.

In any arbitrary FET, the gate voltage indicates a gate potential with respect to the source potential of the FET. In any arbitrary FET, the state ON indicates a conductive state between the drain and the source of the FET and the state OFF indicates a non-conductive state (cut-off state) between the drain and the source of the FET.

The drain terminal 17 is connected to the drain of the GaNFET 11, the source terminal 19 is connected to the source of the MOSFET 12, and the gate terminal 18 is connected to the gate of the MOSFET 12. The source of the GaNFET 11 and the drain of the MOSFET 12 are commonly connected to each other. The gate of the GaNFET 11 is connected to the source of the MOSFET 12 via the resistance element 13. As it is well known, the GaNFET has a large gain and thus, easily oscillates. The resistance element 13 is disposed in order to suppress the oscillation. The gate of the GaNFET 11 may be connected directly to the source of the MOSFET 12 without being via the resistance element 13. As described above, the GaNFETs 11 and 12 are cascode-connected (are connected in a cascode configuration). That is, the multiple-unit semiconductor device 1 has a configuration in which the GaNFET 11 as the gate grounded FET is stacked on the MOSFET 12 as the source grounded FET.

The GaNFET 11 is a 4-terminal type FET, and includes a substrate terminal in addition to the drain, source, and gate terminals. The substrate terminal of the GaNFET 11 is connected to the ground. Similarly to the MOSFET 12, the substrate terminal of the MOSFET 12 is also connected to the ground (that is, in MOSFET 12, the substrate terminal and the source terminal are common). Note that the substrate terminal is also referred to as a "back gate terminal" or a "bulk terminal".

A control circuit (not illustrated) connected to the gate terminal 18 supplies a gate voltage to the MOSFET 12 via the gate terminal 18, and switches the ON state and the OFF state of the MOSFET 12 by controlling the gate voltage of the MOSFET 12. When the MOSFET 12 is in an ON state, since the gate voltage of the GaNFET 11 becomes substantially zero V (volt), the GaNFET 11 is also in an ON state. When the MOSFET 12 is in an OFF state, the drain potential of the MOSFET 12 increases, and the gate voltage of the GaNFET 11 becomes lower than the threshold voltage $V_{TH11}$ due to that increase, and thus, the GaNFET 11 also turns to an OFF state. Consequently, in the multiple-unit semiconductor device 1 that functions as one switching element, the state becomes ON between the drain terminal 17 and the source terminal 19 (becomes conductive state) if the MOSFET 12 is in an ON state, and becomes OFF (becomes a non-conductive state) if the MOSFET 12 is in an OFF state. That is, the multiple-unit semiconductor device 1 realizes an operation of one normally-OFF type FET.

A series circuit configured with the capacitor 14 and the resistance element 15 is arranged between the drain terminal 17 and the source terminal 19, and a connection point between the capacitor 14 and the resistance element 15 is connected to the gate of the MOSFET 16. Specifically, one end of the capacitor 14 is connected to the drain terminal 17 and one end of the resistance element 15 is connected to the source terminal 19, the other end of the capacitor 14 and the other end of the resistance element 15 are commonly connected to the gate of the MOSFET 16. The MOSFET 16 is connected to the MOSFET 12 in parallel. That is, the drain and source of the MOSFET 16 are commonly connected to the drain and source of the MOSFET 12, respectively. A connection point of the gate of the MOSFET 16 and the resistance element 15 is referred to as a "node A".

The ESD protection circuit is configured with the capacitor 14, the resistance element 15, and the FET 16, and the GaNFET 11 or the like is protected from the ESD surge owing to the ESD protection circuit. The protection operation will be described below.

Now, it is assumed that a surge due to an electro-static discharge (ESD) (hereinafter, referred to as ESD surge) is applied to the drain terminal 17 when the MOSFET 12 is in an OFF state. The ESD surge flows into the drain terminal 17 through an external wiring of the multiple-unit semiconductor device 1, the external wiring allowing the power supply voltage VDD to be applied, or the ESD surge is directly applied to the drain terminal 17. The ESD surge considered here is assumed to be a surge that increases the potential of the drain terminal 17 with respect to the ground potential as a reference.

Figure 2:
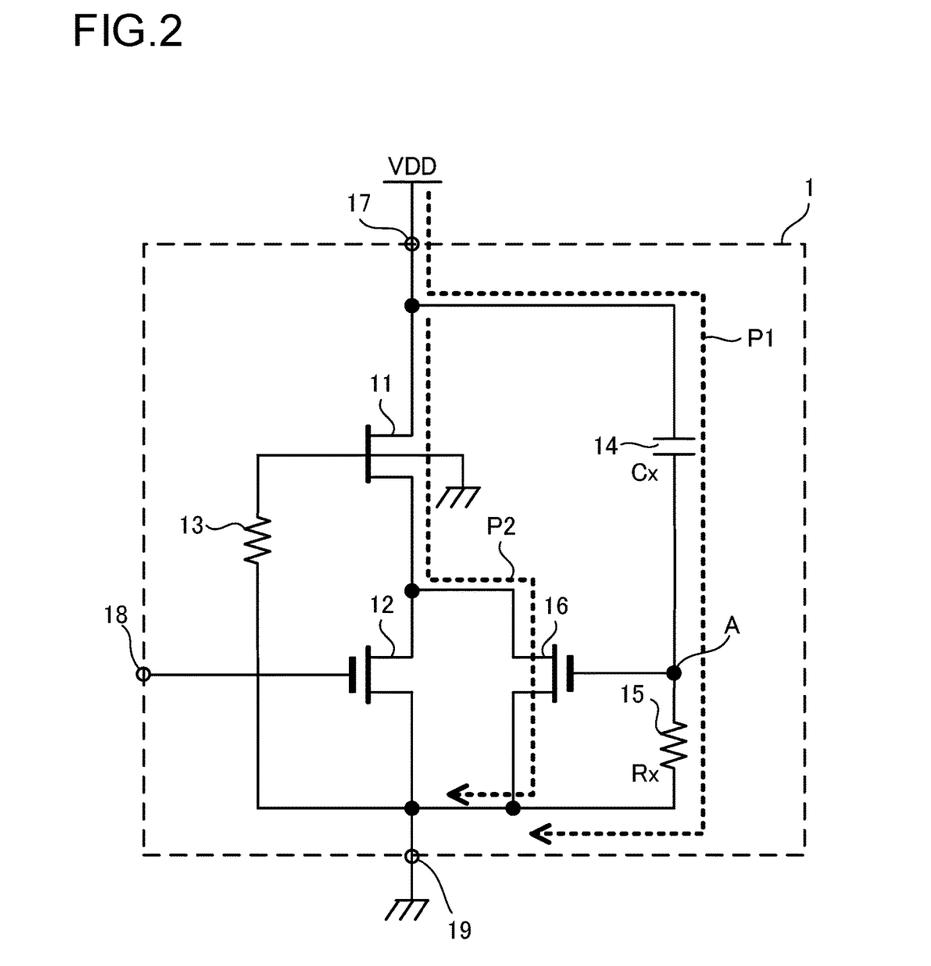
FIG. 2 is a diagram for describing a discharge path of an ESD surge current in the first embodiment of the present invention.

When the ESD surge is applied to the drain terminal 17, as illustrated in FIG. 2, an ESD surge current due to the ESD surge flows into the source terminal 19 having the ground potential while passing through a discharge path (sub-discharge path) P1 through the capacitor 14 and the resistance element 15. The discharge path P1 does not have a sufficient capability to discharge all the current of the applied ESD surge (having such a sufficient capability is not practical because capacitance of the capacitor 14 needs to be increased).

When the ESD surge current passes through the resistance element 15, a voltage is generated at the resistance element 15. When the voltage generated at the resistance element 15 (that is, the voltage at the node A) becomes equal to or higher than the threshold voltage $V_{TH16}$ of the MOSFET 16, the MOSFET 16 turns to an ON state. Then, the source potential of the GaNFET 11 which was in an OFF state up to now decreases, and thus, the GaNFET 11 turns to an ON state. Then, a new discharge path (main discharge path) P2 in FIG. 2 for discharging the ESD surge current is formed. The discharge path P2 includes a path between the drain and the source of the GaNFET 11 and a path between the drain and the source of the MOSFET 16. That is, when the MOSFET 16 turns to an ON state based on the generated voltage in the resistance element 15, the ESD surge current from the drain terminal 17 is allowed to be discharged to the source terminal 19 (that is, the ground) through the GaNFET 11 and the MOSFET 16.

Impedance between the drain terminal 17 and the source terminal 19 decreases due to the forming of the discharge path P2, and it is possible to suppress the increase of the voltage between the drain and the substrate terminal of the GaNFET 11 which is a cause of a lack of the ESD resistance. That is, it is possible to suppress the flow of the ESD surge current between the drain and the substrate terminal of the GaNFET 11, and thus, it is possible to increase the ESD resistance in the whole multiple-unit semiconductor device 1. In increasing the ESD resistance, additionally required components are minimal. That is, it is possible to increase the ESD resistance with a simple configuration.

Incidentally, in the original operation of the circuit including the multiple-unit semiconductor device 1, a switching signal is applied to the drain terminal 17, and thus, the potential of the drain terminal 17 is changed due to the applied signal. For example, sometimes the voltage value at the drain terminal 17 becomes the voltage value of positive power supply voltage VDD, and sometimes becomes zero due to the applied signal. It is necessary that the discharge path P2 is not formed according to this switching signal, and the discharge path P2 is necessarily formed only when the ESD surge is applied.

Therefore, the multiple-unit semiconductor device 1 is formed such that Equations (1) and (2) below are satisfied.

$$Cx \cdot Rx \cdot (dV/dt)_{ESD} > V_{TH16} \quad (1)$$

$$Cx \cdot Rx \cdot (dV/dt)_{SWITCH} < V_{TH16} \quad (2)$$

Here, Cx and Rx indicate an electro-static capacitance value of the capacitor 14 and a resistance value of the resistance element 15, respectively (refer to FIG. 2). $(dV/dt)_{ESD}$ indicates an amount of voltage change per unit time at the drain terminal 17 when the ESD surge is applied to the drain terminal 17. $(dV/dt)_{SWITCH}$ indicates an amount of voltage change of the switching signal applied to the drain terminal 17 per unit time, that is, an amount of voltage change per unit time at the drain terminal 17 when the switching signal is applied to the drain terminal 17. The amount of voltage change per unit time at the drain terminal 17 may be considered to be an amount of increasing change in the voltage, that is, a voltage increasing speed at the drain terminal 17. Equation (1) is an equation of condition for the MOSFET 16 to be in an ON state when the ESD surge is applied to the drain terminal 17, and for the discharge path P2 to be formed. Equation (2) is an equation of condition for the MOSFET 16 not to be in an ON state when the switching signal is applied to the drain terminal 17.

Here, $(dV/dt)_{ESD}$ is larger than $(dV/dt)_{SWITCH}$. Specifically, for example, $(dV/dt)_{SWITCH}$ is approximately $1 \times 10^{10}$ [V/sec], and $(dV/dt)_{ESD}$ is approximately $1 \times 10^{11}$ [V/sec]. The voltage change speed of the drain terminal 17 due to the ESD surge is higher than that of the switching signal by approximately 10 times. In the numerical example, when the electro-static capacitance value Cx is 0.5 pF (pico farad) and the resistance value Rx is 200Ω (ohm), $Cx \cdot Rx \cdot (dV/dt)_{ESD}$ is approximately 10 V and $Cx \cdot Rx \cdot (dV/dt)_{SWITCH}$ is approximately 1 V. Therefore, if the threshold voltage $V_{TH16}$ is approximately 5 V, then, both Equations (1) and (2) are satisfied.

Figure 3:
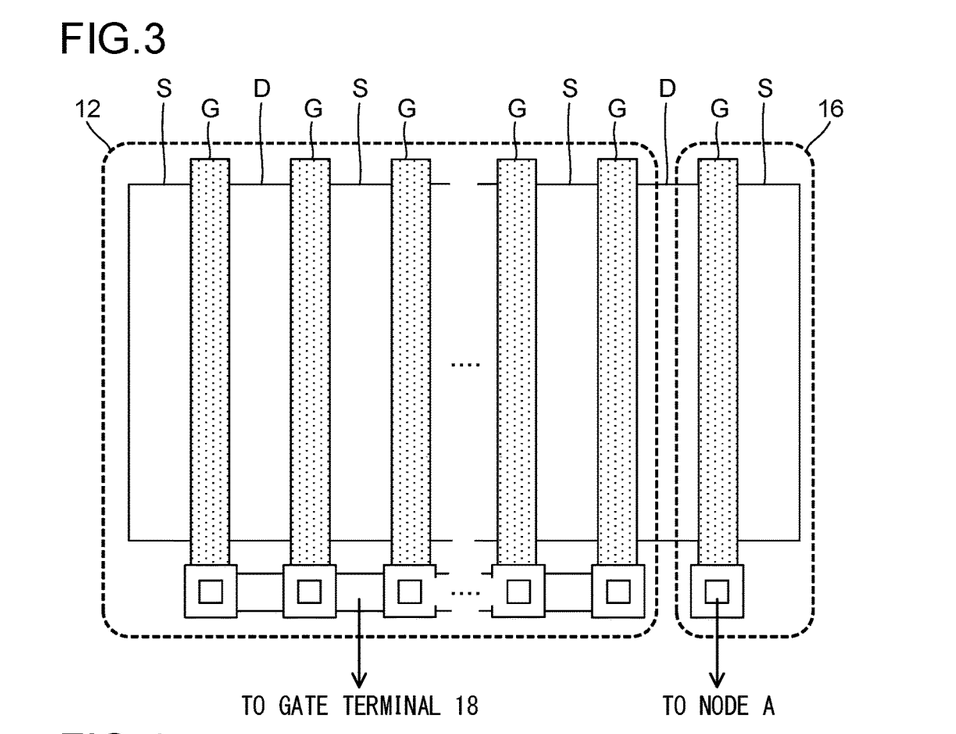
FIG. 3 is a schematic layout diagram of a MOSET chip in the first embodiment of the present invention.

A method of forming the MOSFETs 12 and 16 will be described with reference to FIG. 3. FIG. 3 is a schematic layout diagram of a MOSFET chip in the multiple-unit semiconductor device 1. The multiple-unit semiconductor device 1 is a semiconductor device for power element, and a channel width of the MOSFET 12 is significantly thick such that the low ON-state resistance property of the GaNFET 11 not impaired. In order to achieve this, N pieces of unit FETs each called finger are arrayed in parallel, and the number N of the arrayed fingers is made to be several tens to several hundreds. Each unit FET is a normally-OFF type MOSFET configured to include a source area S, drain area D, and gate area G that form the source, drain, and gate, respectively. However, one drain area D or one source area S is shared between the two unit FETs adjacent to each other.

The MOSFETs 12 and 16 are formed with N pieces of unit FETs. The source areas S of the N pieces of unit FETs are commonly connected to each other via a metal wiring or the like, and the drain areas D of the N pieces of unit FETs are commonly connected to each other via a metal wiring or the like. In a case where the MOSFET 16 is not provided, by commonly connecting the gate areas G of the first to $N_{th}$ unit FETs which are the N pieces of unit FETs via the metal wiring or the like, it will be sufficient to cause the N pieces of unit FETs to operate as one MOSFET 12. However, in the multiple-unit semiconductor device 1, the gate areas G of the first to $(N-1)_{th}$ unit FETs are commonly connected to each other via the metal wiring or the like and then, those gate areas G are connected to the gate terminal 18 of the multiple-unit semiconductor device 1 while the gate area G of the Nth unit FET is separated from the gate areas G of the first to $(N-1)_{th}$ unit FETs and connected to the node A.

As described above, a part of a plurality of normally-OFF type unit FETs for forming the MOSFET 12 is diverted to form the MOSFET 16 for ESD discharge. In other words, the MOSFET 12 is formed using a part of unit FETs among the plurality of normally-OFF type unit FETs formed in a single MOSFET chip, and the MOSFET 16 is formed using the remaining unit FETs. In this way, desired operation and configuration can be realized without a need for a special chip layout of the MOSFET 16 and the like. As a result, the increase of the area for the chip layout can be avoided, and thus, the increase of the chip cost is suppressed. Since the number of the fingers N is originally large, even if one finger is used for the MOSFET 16, the operation or specification values (ON resistance value or the like) of the multiple-unit semiconductor device 1 is almost not influenced.

For the purpose of increasing the ESD resistance of the multiple-unit semiconductor device 1, the number of fingers $N_{MOSFET16}$ to be used for the MOSFET 16 may be equal to or more than two. That is, the MOSFET 12 may be formed using the first to $(N-N_{MOSFET16})_{th}$ unit FETs, and the MOSFET 16 may be formed using the $(N-N_{MOSFET16}+1)_{th}$ to $N_{th}$ unit FETs ($N_{MOSFET16}$ is an arbitrary integer equal to or greater than one and smaller than N, for example, two or three).

Figure 4:
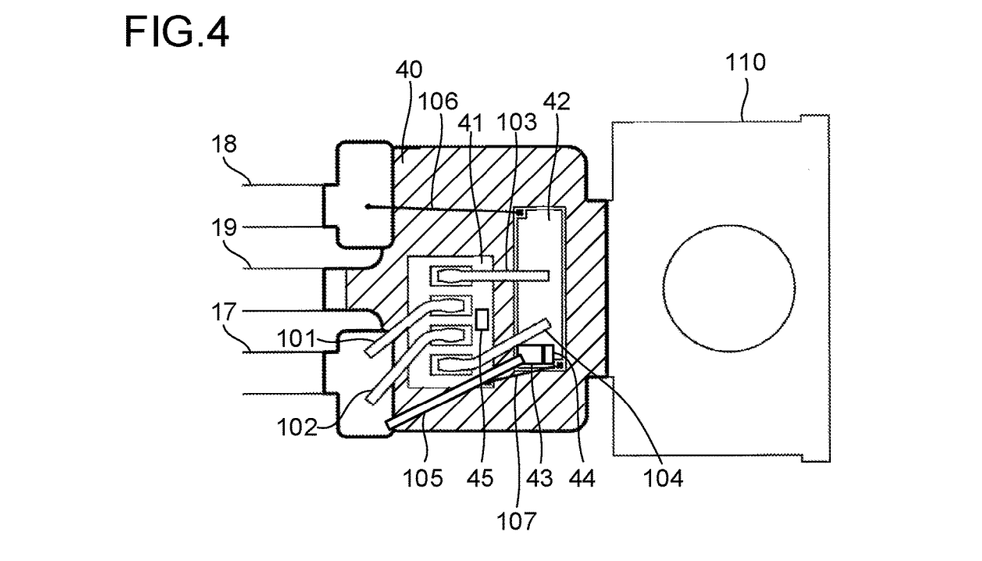
FIG. 4 is a structural diagram of the multiple-unit semiconductor device in the first embodiment of the present invention.

A structural diagram of the multiple-unit semiconductor device 1 is illustrated in FIG. 4. The multiple-unit semiconductor device 1 is configured to include each component illustrated in FIG. 4. A component illustrated in a shaded area in FIG. 4 is a metal body 40. The metal body 40 is connected to the source terminal 19 and has the ground potential. The drain terminal 17 and the gate terminal 18 are fixed on the metal body 40 via an insulation film. A heat radiating fin 110 is fixed to the metal body 40. It may be considered that the metal body 40 configures a part of the heat radiating fin 110.

A GaNFET chip 41 on which the GaNFET 11 in FIG. 1 is formed and a MOSFET chip 42 on which the MOSFETs 12 and 16 in FIG. 1 are formed are arranged on the metal body 40. The MOSFET chip 42 is divided into the part for the MOSFET 12 (part of upper side in FIG. 4) and the part for MOSFET 16 (part of lower side in FIG. 4) by a gate wiring in the MOSFET chip 42 as described above. Furthermore, a capacitance element 43 and a resistance element 44 that function as the capacitor 14 and the resistance element 15 in FIG. 1 are formed in the MOSFET chip 42. The capacitance element 43 is formed, for example, from a metal-insulator-metal (MIM) capacitor that is made from two metal wire layers and an insulation film in the MOSFET chip 42, and the resistance element 44 is formed by layout arranging the layers used for the MOSFET channel layers in the MOSFET chip 42 for using the resistance element. A resistance element 45 that functions as the resistance element 13 in FIG. 1 is provided on the GaNFET chip 41.

The terminals 17 to 19 and the GaNFET 11, MOSFETs 12 and 16, resistance elements 13 and 15 and the capacitor 14 configured with the components 41 to 45 are connected according to the connection relations described above using wires 101 to 107 formed from gold, aluminum, or the like.

Specifically, the wires 101 and 102 are wires (hereinafter, referred to as a "first current path wire") for connecting the drain terminal 17 to the drain of the GaNFET 11. The wires 103 and 104 are wires (hereinafter, referred to as a "second current path wire") for connecting the source of the GaN-FET 11 to the drain of the MOSFET 12. The current capacity flowing between the drain terminal 17 and the source terminal 19 can be increased by providing the two wires 101 and 102 as the first current path wire and providing the two wires 103 and 104 as the second current path wire. The two wires 101 and 102 as the first current path wire and the two wires 103 and 104 as the second current path wire are provided for the purpose of supplying uniform signals, of the group of fingers in the MOSFET chip 42, to the group of fingers arranged on the upper side in FIG. 4, and to the group of fingers arranged on the lower side in FIG. 4. Of course, each of the first and second current path wires can be formed from one wire or three or more wires according to the specification or the chip size of the multiple-unit semiconductor device 1.

A wire 105 is a wire for connecting the drain terminal 17 to the capacitance element 43 (capacitor 14). A wire 106 is a wire for connecting the gate of the MOSFET 12 formed in the MOSFET chip 42 to the gate terminal 18. One end of a resistance element 45 is connected to the gate of the GaN-FET 11 in the GaNFET chip 41 via the metal wiring in the GaNFET chip 41. The other end of the resistance element 45 is connected to the sources of the MOSFETs 12 and 16 in the MOSFET 42 chip via the metal wiring in the GaNFET chip 41 and a wire 107 between the chips 41 and 42

Although not illustrated in FIG. 4, all of the components 41 to 45 and the wires 101 to 107, and a part of each of the terminals 17 to 19 are hardened by mold resin material and are fixed in the mold resin material, and the remaining part of the terminals 17 to 19 and the heat radiating fin 110 extrude from the mold resin material. The mold resin material functions as a package accommodating the multiple-unit semiconductor device 1.

Second Embodiment

A second embodiment of the present invention will be described. A second embodiment and a third and fourth embodiment described below are embodiments based on the first embodiment. With regard to matters not particularly stated in the second to fourth embodiments, the matters disclosed in the first embodiment will be applied to the second to fourth embodiments as long as there is no contradiction. As long as there is no contradiction, any arbitrary plurality of embodiments in the first to fourth embodiments may be combined.

In the first embodiment, the capacitance component is interposed between the drain terminal 17 and the node A by providing the capacitor 14 between the drain terminal 17 and the node A. However, with any arbitrary element having the capacitance component, the capacitance component may be interposed between the drain terminal 17 and the node A.

Figure 5:
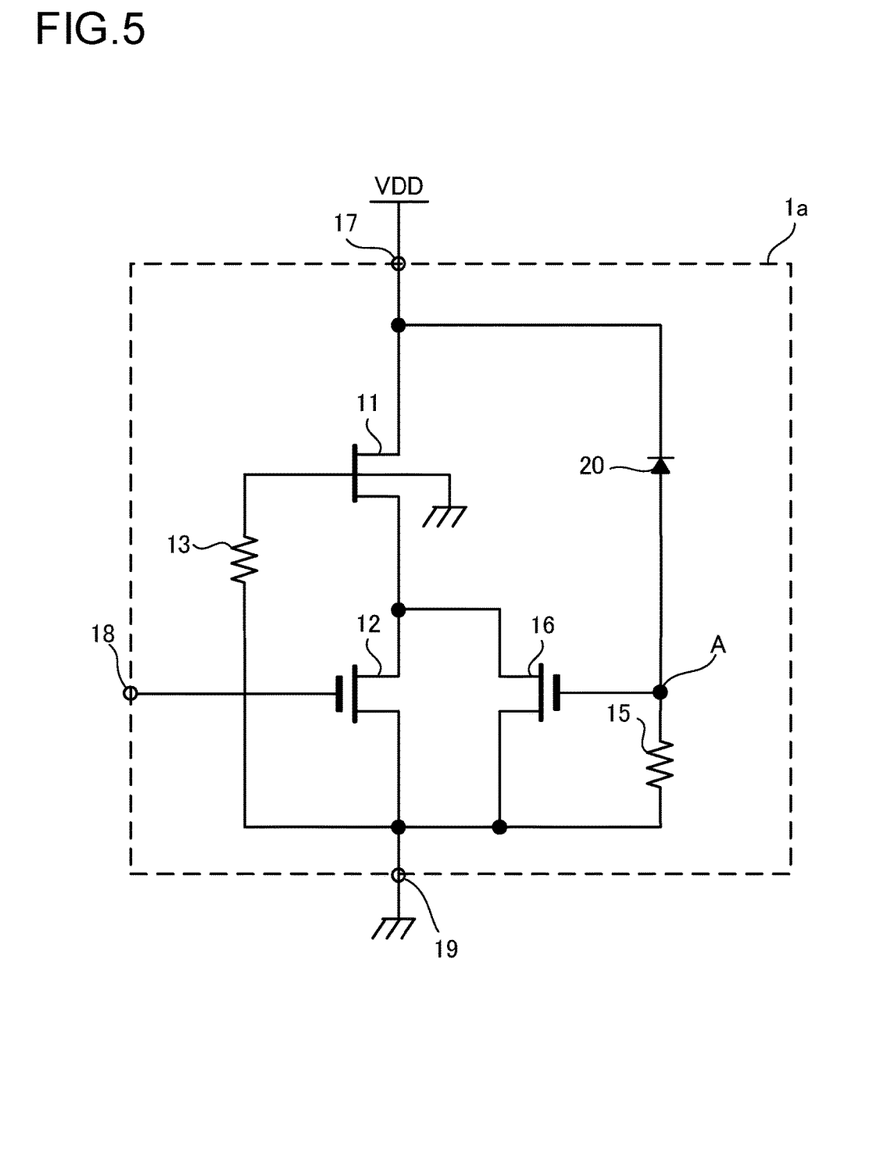
FIG. 5 is a circuit diagram of a multiple-unit semiconductor device in a second embodiment of the present invention.

For example, as illustrated in FIG. 5, a diode 20 may be provided instead of the capacitor 14. FIG. 5 is a circuit diagram of a multiple-unit semiconductor device 1a in the second embodiment. The multiple-unit semiconductor device 1a is formed by replacing the capacitor 14 with the diode 20 based on the multiple-unit semiconductor device 1 in FIG. 1. Excluding the replacement, the device 1 and 1a are the same. In the multiple-unit semiconductor device 1a, a cathode of the diode 20 is connected to the drain terminal 17 and an anode of the diode 20 is connected to the connection point (that is, the node A) of the gate of the MOSFET 16 and the resistance element 15.

As it is well known, since there exists a capacitance component (a parasitic capacitance component) between the anode and the cathode of the diode 20, the capacitance component of the diode 20 exerts a function same as that of the capacitor 14 in FIG. 1. Therefore, in the second embodiment also, it is possible to obtain the actions and effects similar to that in the first embodiment. The increase of the layout area for disposing the capacitor 14 can also be suppressed. In the configuration in FIG. 5, the electrostatic capacitance value of the capacitance component (the parasitic capacitance component) between the anode and the cathode of the diode 20 corresponds to the "Cx" described above.

Third Embodiment

Figure 6:
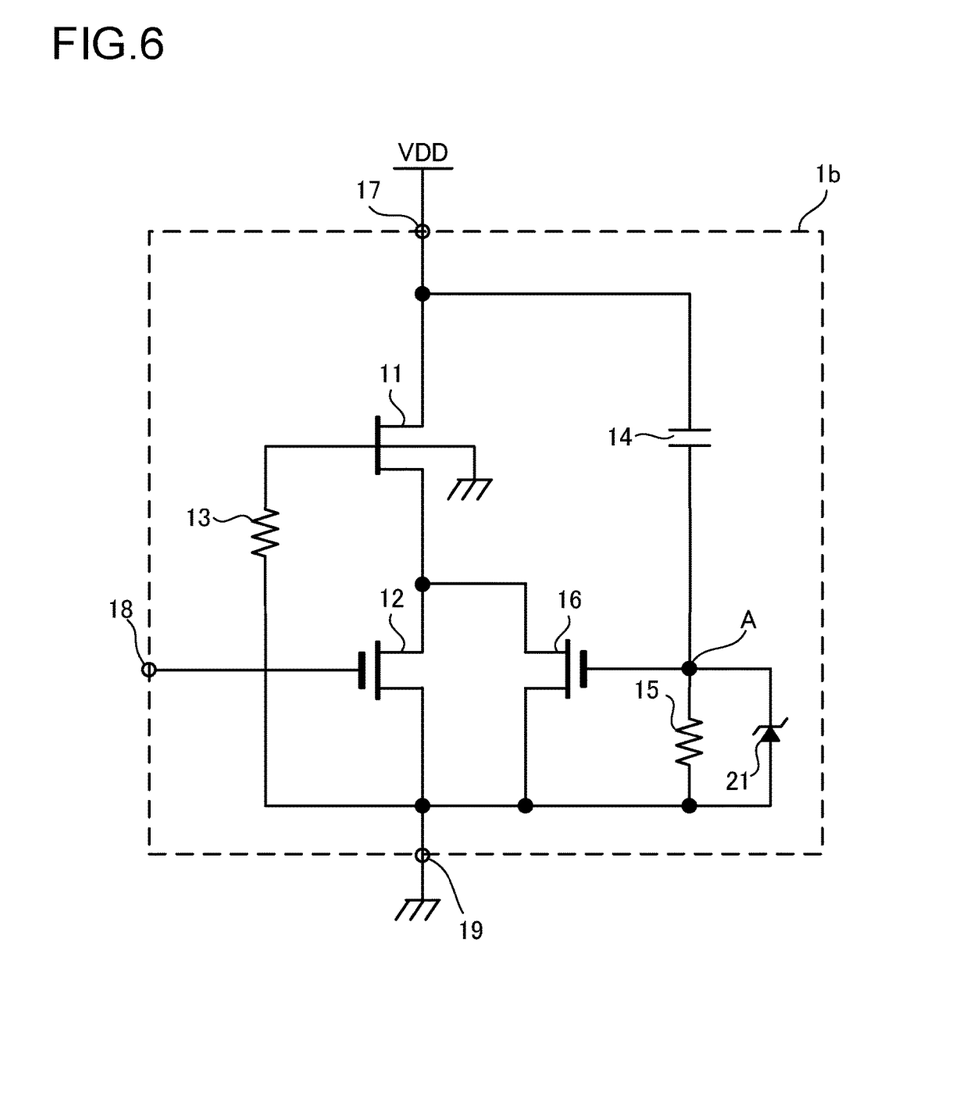
FIG. 6 is a circuit diagram of a multiple-unit semiconductor device in a third embodiment of the present invention.

A third embodiment of the present invention will be described. FIG. 6 is a circuit diagram of a multiple-unit semiconductor device 1b in the third embodiment. The multiple-unit semiconductor device 1b is formed by adding a Zener diode 21 based on the multiple-unit semiconductor device 1 in FIG. 1. Excluding the addition, the device 1 and 1b are the same.

In the multiple-unit semiconductor device 1b, an anode of the Zener diode 21 is connected to the source terminal 19, and a cathode of the Zener diode 21 is connected to the connection point (that is, the node A) of the gate of the MOSFET 16 and the resistance element 15. A Zener voltage in the Zener diode 21 is higher than the threshold voltage $V_{TH16}$ of the MOSFET 16, and is lower than a maximum rating voltage between the gate and source of the MOSFET 16. It is possible to prevent an over-voltage from being applied to the gate of the MOSFET 16 by providing the Zener diode 21.

The technology described in the second embodiment may be applied to the multiple-unit semiconductor device 1b That is, in the multiple-unit semiconductor device 1b, the capacitor 14 may be replaced with the diode 20.

Fourth Embodiment

A fourth embodiment of the present invention will be described. A technology in the fourth embodiment may be applied to any of the first to third embodiments, and hereinafter, for sake of the specific description, the technology in the fourth embodiment will be described referring to the multiple-unit semiconductor device 1 (FIG. 1) in the first embodiment.

As described in the first embodiment, it is needed that the discharge path P2 (refer to FIG. 2) is formed only when the ESD surge is applied while the discharge path P2 is not formed when the switching signal is applied to the drain terminal 17. In order for this, it is necessary for the multiple-unit semiconductor device 1 to be formed so as to satisfy Equations (1) and (2). However, if an operation frequency of the power circuit applied to the multiple-unit semiconductor device 1 increases, the voltage increasing speed "$(dV/dt)_{SWITCH}$" at the drain terminal 17 due to the switching signal applied to the drain terminal 17 approaches the voltage increasing speed "$(dV/dt)_{ESD}$" at the drain terminal 17 due to the ESD surge applied to the drain terminal 17. Then, the range of the electro-static capacitance value Cx and the resistance value Rx becomes narrow in order to satisfy Equations (1) and (2), and because of the decrease of the design margin, an erroneous operation easily occurs due to the variations of the values.

For example, in a case where the threshold voltage $V_{TH16}$ of the MOSFET 16 is 5V, the electro-static capacitance value Cx is 0.5 pF and the resistance value Rx is 200Ω, when $(dV/dt)_{SWITCH}$ increases from $1 \times 10^{10}$ [V/sec] to $3 \times 10^{10}$ [V/sec], since "Cx·Rx·(dV/dt)$_{SWITCH}$" increases from 1 V to 3 V to satisfy Equation (2), the margin between the "Cx·Rx·(dV/dt)$_{SWITCH}$" and the threshold voltage $V_{TH16}$ decreases from 4 V (=$V_{TH16}$–1 V) to 2 V (=$V_{TH16}$–3 V). Due to the decrease of this margin, the erroneous operation easily occurs, in which the MOSFET 16 becomes an ON state when the switching signal is applied.

A counter measure for avoiding the erroneous operation (ON) of the MOSFET 16 when the switching signal is applied and for decreasing the electro-static capacitance value Cx and/or the resistance value Rx is considered. However, for example, if the resistance value Rx is decreased to 100Ω from 200Ω, "Cx·Rx·(dV/dt)$_{ESD}$" due to the ESD surge decreases to 5 V from 10 V, there also occurs a problem in that the ESD protection circuit does not work (that is, the state of the MOSFET 16 does not become ON) when the ESD surge is applied.

On the other hand, in many cases, the electrical specification of the multiple-unit semiconductor device 1 including the threshold voltage $V_{TH12}$ is necessarily defined separately from the ESD protection circuit and the threshold voltage $V_{TH12}$ is not allowed to be arbitrarily changed for ensuring the above-described margin. Therefore, in the multiple-unit semiconductor device 1 in the fourth embodiment, the threshold voltage $V_{TH16}$ of the MOSFET 16 is made to be higher than the threshold voltage $V_{TH12}$ of the MOSFET 12 by as much as a predetermined amount. For example, in the example of the numerical values above, the threshold voltage $V_{TH12}$ is set to 5V and the threshold voltage $V_{TH16}$ is set to 6V. Then, the above-described margin increases to 3 V from 2 V (that is, increases by 1.5 times), and it is possible to suppress the erroneous operation in which the state of the MOSFET 16 becomes ON when the switching signal is applied.

Figure 7:
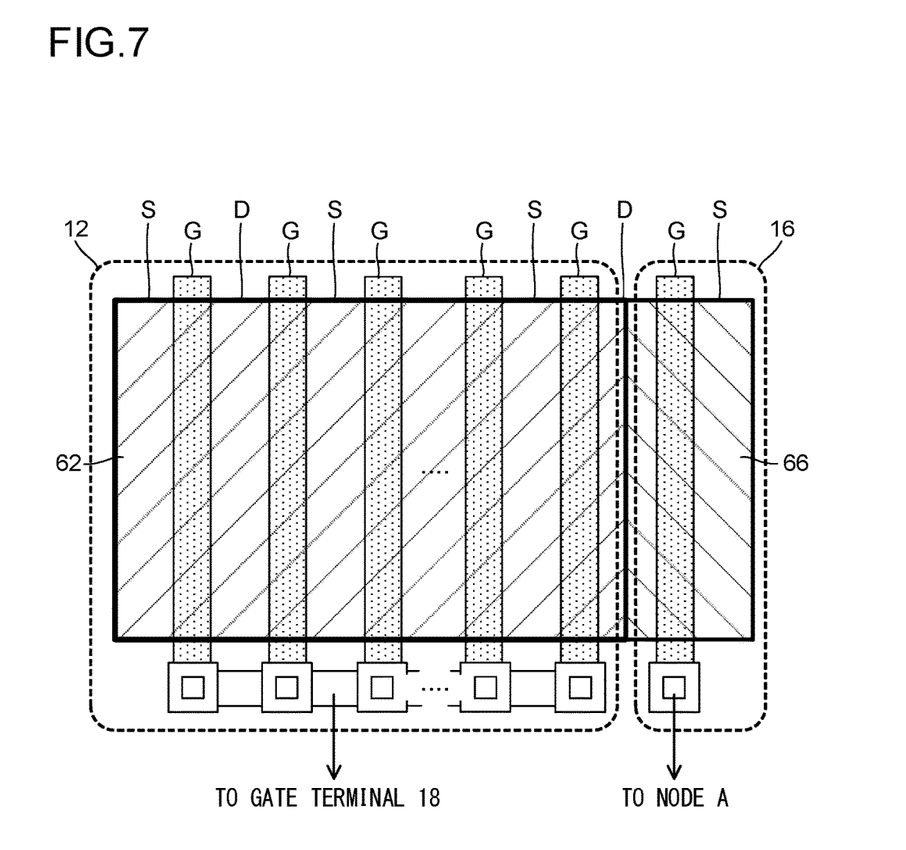
FIG. 7 is a schematic layout diagram of a MOSET chip in a fourth embodiment of the present invention, and illustrates an aspect in which a two-channel implantation is adopted in a chip.

FIG. 7 is a diagram for describing the method of making the threshold voltage $V_{TH16}$ be higher than the threshold voltage $V_{TH12}$. In the process for manufacturing the MOSFET, an impurity concentration in the channel is controlled by performing an ion implantation called channel implantation in the transistor area, and then, the threshold voltage of the MOSFET is controlled by controlling the impurity concentration. Usually, a type of the impurity concentration in the channel for one MOSFET chip is one type. However, as illustrated in FIG. 7, a channel implantation 62 is performed on the transistor area (drain area D, source area S, and gate area G) forming the MOSFET 12, and a channel implantation 66 which is different from the channel implantation 62 is performed on the transistor area (drain area D, source area S, and gate area G) forming the MOSFET 16. The impurity concentration implanted by the channel implantation 62 is different from the impurity concentration implanted by the channel implantation 66. As a result, it is possible to make the threshold voltage $V_{TH16}$ be higher than the threshold voltage $V_{TH12}$.

If the threshold voltage is allowed to be arbitrarily changed, in order to ensure the above-described margin, the threshold voltage $V_{TH12}$ and the threshold voltage $V_{TH16}$ may be increased by the same amount in accordance with increase of the "(dV/dt)$_{SWITCH}$" while keeping the values of the threshold voltage $V_{TH12}$ and the threshold voltage $V_{TH16}$ the same to each other. If the values of the threshold voltage $V_{TH12}$ and the threshold voltage $V_{TH16}$ are the same, the type of the impurity concentration in the channel for one MOSFET chip can be one type, and thus the manufacturing process can be simplified.

<Modification or the Like>

The embodiments of the present invention can variously and appropriately be modified or changed within the scope of the technological idea disclosed in the aspects attached hereto. The embodiments described above are just examples of the embodiments, of the present invention, and the meanings of the terms of the present invention and the configuration elements thereof are not limited by the terms disclosed in the embodiments described above. The specific values indicated in the description above are just examples, and as a matter of course, the values can be changed to various other values.

In each embodiment described above, the MOSFET 16 is used as the switching element for discharge connected to the MOSFET 12 in parallel. However, a semiconductor switching element other than the MOSFET, for example, a junction type field effect transistor (hereinafter, referred to as "JFET") or a bipolar transistor may be used as the switching element for discharge. Also in a case where the switching element for discharge is the semiconductor switching element other than the MOSFET, the control electrode for the switching element for discharge is connected to the node A which is the connection point between the capacitance component (for example, the one end of the capacitor 14 or the anode of the diode 20) and the resistance element 15. The control electrode of the MOSFET and the JFET is the gate, and control electrode of the bipolar transistor is a base.

That is, in the multiple-unit semiconductor device 1, 1a, or 1b in FIG. 1, FIG. 2 or FIG. 5, in a case where a n-channel JFET is used as the switching element for discharge, a drain, a source, and a gate of the JFET is respectively connected to the drain of the MOSFET 12, the source of the, MOSFET 12, and the node A, and in a case where the NPN bipolar transistor is used as the switching element for discharge, a collector, an emitter, and a base of the NPN bipolar transistor is respectively connected to the drain of the MOSFET 12, the source of the MOSFET 12, and the node A. In any case, when the ESD surge is applied to the drain terminal 17, the switching element for discharge is in an ON state based on the voltage generated on the resistance element 15 due to the ESD surge current in the discharge path P1, and then, the discharge path P2 is formed. The discharge path P2 is a path passing through the GaNFET 11 and the switching element for discharge.

As a matter of course, in a case where the semiconductor switching element other than the MOSFET is used as the switching element for discharge, the switching element for discharge is created in a process other than the process of manufacturing the MOSFET 12.

In each embodiment described above, it is assumed that the normally-ON type FET 11 is formed as the GaNFET. However, the normally-ON type FET 11 may be an FET other than the GaNFET, for example, an SiCFET (an FET formed on silicon carbide). The normally-OFF type FET 12 is not limited to the MOSFET as well. For example, the normally-OFF type FET 12 may be a Schottky type FET. The FETs 11 and 12 may be p-channel type FETs (however, in this case, the gate drive with the power supply voltage VDD as a reference is needed).

<A Study on the Present Invention>

A study on the present invention will be performed.

The multiple-unit semiconductor device (1, 1a, or 1b) in an aspect of the present invention includes the normally-ON type first FET (11) and the normally-OFF type second FET (12) that are connected to each other in series between first and second terminals (17 and 19). The device further includes the protection circuit that includes the switching element for discharge (16) connected to the second FET in parallel and a trigger circuit that is disposed between the first and the second terminals and causes the switching element for discharge to turn to an ON state when a surge is applied to the first terminal.

In this way, since the switching element for discharge is in an ON state when the surge is applied to the first terminal, it is possible to discharge a surge current to the second terminal through the first FET and the switching element for discharge. That is, it is possible to improve the resistance to the ESD surge or the like in the multiple-unit semiconductor device by mounting the protection circuit described above. In increasing the ESD resistance, additionally required components are minimal. Therefore, it is possible to increase the ESD resistance with a simple configuration.

In the multiple-unit semiconductor device 1 or 1*b* illustrated in FIG. 1 or FIG. 6, it may be considered that the trigger circuit is configured to include at least the capacitor 14, the resistance element 15, and the MOSFET 16. In the multiple-unit semiconductor device 1*a* illustrated in FIG. 5, it may be considered that the trigger circuit is configured to include at least the diode 20, the resistance element 15 and the MOSFET 16.

Specifically, for example, the trigger circuit includes capacitance component (14 or 20) interposed between the first terminal and a control electrode of the switching element for discharge, and a resistance element (15) disposed between the control electrode of the switching element for discharge and the second terminal.

In this way, it is possible to cause the switching element for discharge to turn to an ON state by generating a voltage in the resistance element when the surge is applied to the first terminal.

Specifically, for example, when the surge is applied to the first terminal, the protection circuit may cause the switching element for discharge to turn to an ON state based on the voltage generated in the resistance element, and may cause the surge current from the first terminal to be discharged to the second terminal through the first FET and the switching element for discharge.

In this way, it is possible to suppress the first FET from being destroyed or deteriorating due to the surge current flowing into the substrate terminal or the like of the first FET. That is, the first FET can be protected from the destruction or the like due to the surge, and thus, it is possible to improve the whole resistance of the multiple-unit semiconductor device.

For example, in the multiple-unit semiconductor device (1, 1*a*, or 1*b*), a part of a plurality of normally-OFF type unit FETs for forming the second FET may be diverted to form the FET for discharge as the switching element for discharge.

In this way, desired operation and configuration can be realized without a need for a special chip layout of the switching for discharge and the like. As a result, the increase of the area for the chip layout can be avoided, and thus, the increase of the chip cost is suppressed.

For example, in the multiple-unit semiconductor device (1, 1*a*, or 1*b*), the threshold voltage of the FET for discharge as the switching element for discharge may be higher than the threshold voltage of the second FET.

In this way, it is possible to suppress the erroneous operation from occurring, in which the FET for discharge is in an ON state when it is not necessary, without changing the threshold voltage of the second FET.

REFERENCE SIGNS LIST

1, 1*a*, 1*b* multiple-unit semiconductor device
11 GaNFET
12, 16 MOSFET
13, 15 resistance element
14 capacitor
17 drain terminal
18 gate terminal
19 source terminal
20 diode
21 Zener diode
41 GaNFET chip
42 MOSFET chip

The invention claimed is:

1. A multiple-unit semiconductor device including a normally-ON type first FET and a normally-OFF type second FET that are connected to each other in series between a first terminal and a second terminal, the device comprising:
   a protection circuit that includes a switching element for discharge connected to the second FET in parallel and a trigger circuit that is connected in parallel to a series circuit of the first and second FETs and causes the switching element for discharge to turn to an ON state when a surge is applied to the first terminal.

2. The multiple-unit semiconductor device according to claim 1,
   wherein the trigger circuit includes a capacitance component interposed between the first terminal and a control electrode of the switching element for discharge, and a resistance element disposed between the control electrode of the switching element for discharge and the second terminal.

3. The multiple-unit semiconductor device according to claim 2,
   wherein the protection circuit causes the switching element for discharge to turn to an ON state based on a voltage generated in the resistance element when the surge is applied to the first terminal, and causes a surge current from the first terminal to be discharged to the second terminal through the first FET and the switching element for discharge.

4. The multiple-unit semiconductor device according to claim 1,
   wherein a threshold voltage of the FET for discharge as the switching element for discharge is higher than a threshold voltage of the second FET.

5. The multiple-unit semiconductor device according to claim 1, wherein
   a drain of the first FET is connected to the first terminal,
   a source of the second FET is connected to the second terminal,
   a source of the first FET and a drain of the second FET are connected together,
   the switching element for discharge is an FET for discharge,
   a drain of the FET for discharge and the drain of the second FET are connected together,
   a source of the FET for discharge and the source of the second FET are connected together,
   one end of the trigger circuit is connected to the drain of the first FET, and
   another end of the trigger circuit is connected to the source of the second FET.

6. A multiple-unit semiconductor device including a normally-ON type first FET and a normally-OFF type second FET that are connected to each other in series between a first terminal and a second terminal, the device comprising:

a protection circuit that includes a switching element for discharge connected to the second FET in parallel and a trigger circuit that is disposed between the first terminal and the second terminal and causes the switching element for discharge to turn to an ON state when a surge is applied to the first terminal, wherein a part of a plurality of normally-OFF type unit FETs for forming the second FET is diverted to form an FET for discharge as the switching element for discharge.

* * * * *